US010867967B2

(12) United States Patent
Chen et al.

(10) Patent No.: US 10,867,967 B2
(45) Date of Patent: *Dec. 15, 2020

(54) CHIP PACKAGE WITH REDISTRIBUTION LAYERS

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/663,064

(22) Filed: Oct. 24, 2019

(65) Prior Publication Data

US 2020/0058620 A1  Feb. 20, 2020

Related U.S. Application Data

(63) Continuation of application No. 15/609,743, filed on May 31, 2017, now Pat. No. 10,461,060.

(51) Int. Cl.
*H01L 25/065* (2006.01)
*H01L 23/498* (2006.01)
(Continued)

(52) U.S. Cl.
CPC ...... *H01L 25/0657* (2013.01); *H01L 21/6835* (2013.01); *H01L 23/3128* (2013.01); *H01L 23/49838* (2013.01); *H01L 23/5389* (2013.01); *H01L 24/19* (2013.01); *H01L 24/20* (2013.01); *H01L 24/97* (2013.01); *H01L 25/105* (2013.01); *H01L 25/50* (2013.01); *H01L 21/561* (2013.01); *H01L 23/49816* (2013.01);
(Continued)

(58) Field of Classification Search
CPC ............. H01L 25/0657; H01L 21/6835; H01L 23/3128; H01L 23/49838; H01L 23/5389; H01L 24/19; H01L 24/20; H01L 24/97; H01L 25/105; H01L 25/50
See application file for complete search history.

(56) References Cited

U.S. PATENT DOCUMENTS 9,000,584 B2  4/2015 Lin et al.
9,048,222 B2  6/2015 Hung et al.
(Continued)

FOREIGN PATENT DOCUMENTS

CN          151992 A    8/2004

*Primary Examiner* — Didarul A Mazumder
(74) *Attorney, Agent, or Firm* — Birch, Stewart, Kolasch & Birch, LLP

(57) ABSTRACT

A chip package is provided. The chip package includes a semiconductor die and a protective layer surrounding the semiconductor die. The chip package also includes an interface between the semiconductor die and the protective layer. The chip package further includes a conductive line over the protective layer and the semiconductor die. The conductive line has a first portion and a second portion in direct contact with the first portion, and the second section at least partially covers the interface. In a top view of the conductive layer, line widths of the first portion and the second portion are different from each other.

20 Claims, 13 Drawing Sheets

(51) Int. Cl.
  *H01L 23/31* (2006.01)
  *H01L 23/538* (2006.01)
  *H01L 25/00* (2006.01)
  *H01L 23/00* (2006.01)
  *H01L 21/683* (2006.01)
  *H01L 25/10* (2006.01)
  *H01L 21/56* (2006.01)

(52) U.S. Cl.
  CPC .............. *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2221/68345* (2013.01); *H01L 2221/68359* (2013.01); *H01L 2224/04105* (2013.01); *H01L 2224/12105* (2013.01); *H01L 2224/13111* (2013.01); *H01L 2224/13124* (2013.01); *H01L 2224/13144* (2013.01); *H01L 2224/13147* (2013.01); *H01L 2224/13157* (2013.01); *H01L 2224/13166* (2013.01); *H01L 2224/13169* (2013.01); *H01L 2224/16235* (2013.01); *H01L 2224/32225* (2013.01); *H01L 2224/73267* (2013.01); *H01L 2224/81005* (2013.01); *H01L 2224/92244* (2013.01); *H01L 2224/97* (2013.01); *H01L 2225/06513* (2013.01); *H01L 2225/06548* (2013.01); *H01L 2225/1035* (2013.01); *H01L 2225/1058* (2013.01); *H01L 2924/15311* (2013.01); *H01L 2924/351* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,461,060 B2 * | 10/2019 | Chen ................ H01L 23/49838 |
| 2011/0121449 A1 | 5/2011 | Lin et al. |
| 2015/0179616 A1 | 6/2015 | Lin et al. |
| 2017/0033080 A1 | 2/2017 | Chen et al. |

* cited by examiner

CHIP PACKAGE WITH REDISTRIBUTION LAYERS

CROSS REFERENCE

This application is a Continuation application of U.S. patent application Ser. No. 15/609,743, filed on May 31, 2017, the entire of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
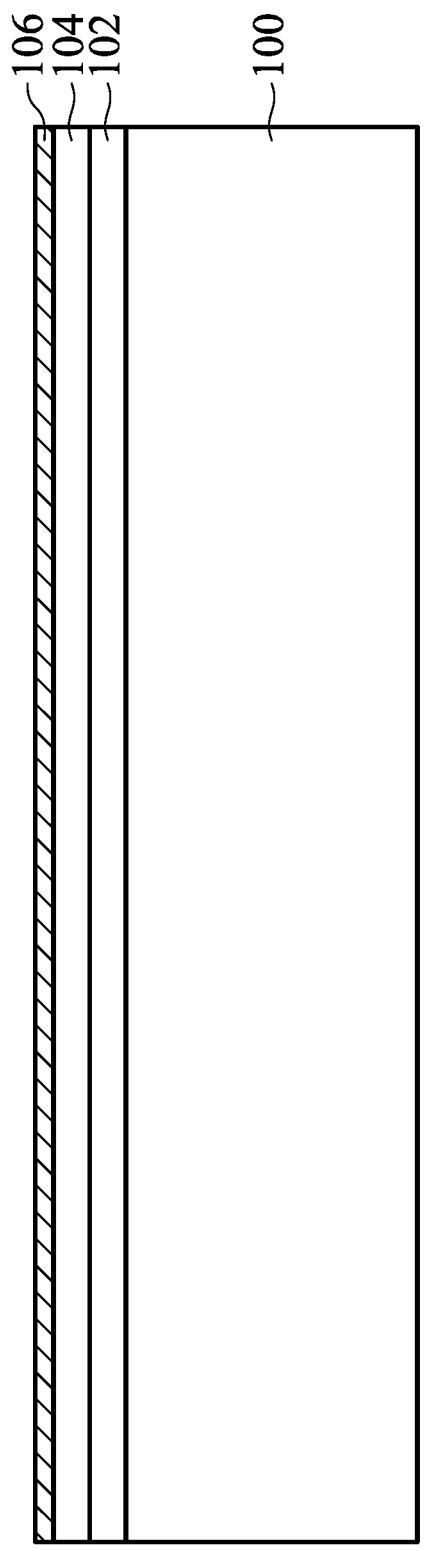
FIGS. 1A-1J are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may be applied in 3D packaging or 3D IC devices. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a chip package, in accordance with some embodiments. As shown in FIG. 1A, an adhesive layer 102 and a base layer 104 are deposited or laminated over a carrier substrate 100, in accordance with some embodiments.

In some embodiments, the carrier substrate 100 is used as a temporary support substrate. The carrier substrate 100 may be made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

The adhesive layer 102 may be made of glue, or may be a lamination material, such as a foil. In some embodiments, the adhesive layer 102 is photosensitive and is easily detached from the carrier substrate 100 by light irradiation. For example, shining ultra-violet (UV) light, infrared light, or laser light on the carrier substrate 100 is used to detach the adhesive layer 102. In some embodiments, the adhesive layer 102 is a light-to-heat-conversion (LTHC) coating. In some other embodiments, the adhesive layer 102 is heat-sensitive. The adhesive layer 102 may be detached using a thermal operation.

In some embodiments, the base layer 104 is a polymer layer or a polymer-containing layer. The base layer 104 may be a polybenzoxazole (PBO) layer, a polyimide (PI) layer, a solder resist (SR) layer, an Ajinomoto buildup film (ABF), a die attach film (DAF), another suitable layer, or a combination thereof. In some embodiments, the base layer 104 includes multiple sub-layers.

Many variations and/or modifications can be made to embodiments of the disclosure. In some other embodiments, the base layer 104 is not formed.

Afterwards, a seed layer 106 is deposited over the base layer 104, as shown in FIG. 1A in accordance with some embodiments. In some embodiments, the seed layer 106 is made of a metal material. The metal material may be made of or include titanium (Ti), Ti alloy, copper (Cu), Cu alloy, another suitable material, or a combination thereof. In some other embodiments, the seed layer 106 includes multiple sub-layers.

In some embodiments, the seed layer 106 is deposited using a physical vapor deposition (PVD) process such as a sputtering process, a chemical vapor deposition (CVD) process, a spin-on process, another applicable process, or a combination thereof.

Many variations and/or modifications can be made to embodiments of the disclosure. In some other embodiments, the seed layer 106 is not formed.

Figure 1B:
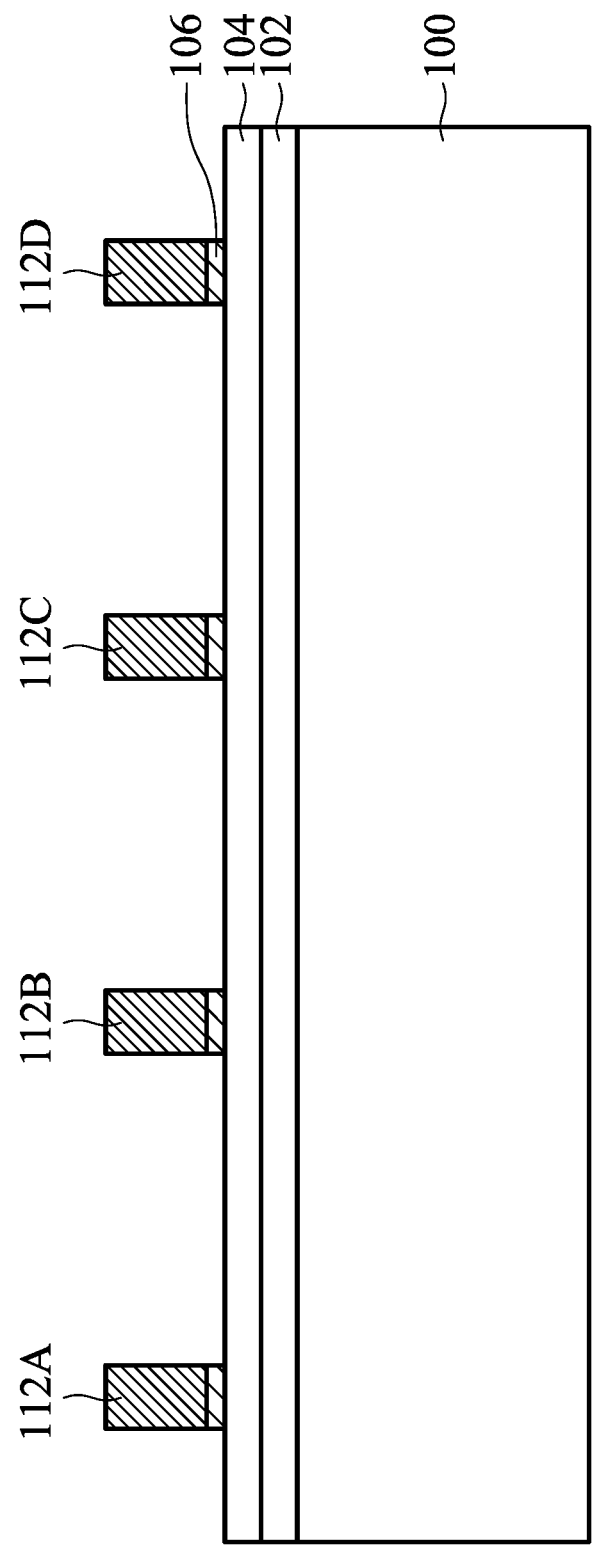

As shown in FIG. 1B, conductive structures including conductive structures 112A, 112B, 112C, and 112D are formed, in accordance with some embodiments. In some embodiments, the conductive structures 112A, 112B, 112C, and 112D include conductive pillars. In some embodiments, each of the conductive structures 112A, 112B, 112C, and 112D has a linear sidewall. In some embodiments, the linear sidewall is substantially perpendicular to a main surface of the base layer 104.

In some embodiments, a mask layer (not shown) is formed over the seed layer 106 to assist in the formation of the conductive structures 112A-112D. The mask layer has multiple openings that expose portions of the seed layer 106. The openings of the mask layer define positions where the conductive structures will be formed. In some embodiments, the mask layer is made of a photoresist material.

In some embodiments, the conductive structures 112A-112D are made of or include a metal material. The metal material may include Cu, Ti, gold (Au), cobalt (Co), aluminum (Al), tungsten (W), another suitable material, or a combination thereof. In some embodiments, the conductive structures 112A-112D are made of or include a solder material. The solder material may include tin (Sn) and other metal elements. In some other embodiments, the conductive structures 112A, 112B, 112C, and 112D are made of a metal material that does not include Sn.

In some embodiments, the conductive structures 112A, 112B, 112C, and 112D are formed using a plating process utilizing the seed layer 106. The plating process may include an electroplating process, an electroless plating process, another applicable process, or a combination thereof.

However, many variations and/or modifications can be made to embodiments of the disclosure. In some other embodiments, the conductive structures 112A, 112B, 112C, and 112D are formed using a chemical vapor deposition (CVD) process, a physical vapor deposition (PVD) process, a spin-on process, another applicable process, or a combination thereof.

Afterwards, the mask layer is removed, and the portions of the seed layer 106 that are not covered by the conductive structures 112A-112D are removed, as shown in FIG. 1B in accordance with some embodiments. An etching process may be used to partially remove the seed layer 106. The conductive structures 112A-112D may function as an etching mask during the etching of the seed layer 106.

Many variations and/or modifications can be made to embodiments of the disclosure. In some other embodiments, the seed layer 106 and/or the conductive structures 112A-112D are not formed.

Figure 1C:
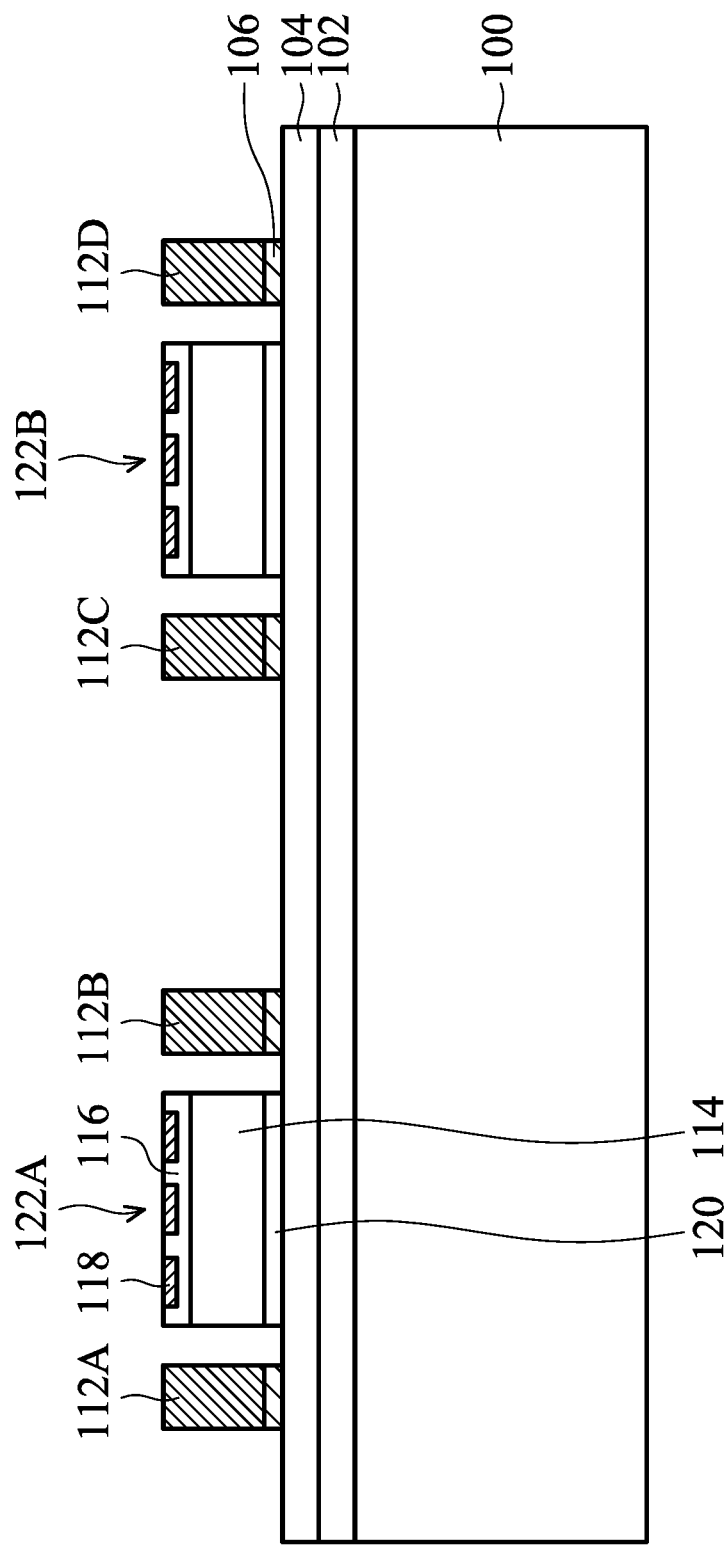

As shown in FIG. 1C, semiconductor dies including semiconductor dies 122A and 122B are attached over the carrier substrate 100, in accordance with some embodiments. In some embodiments, back sides of the semiconductor dies 122A and 122B face the base layer 104 with front sides of the semiconductor dies 122A and 122B facing away therefrom. An adhesive film 120 may be used to affix the semiconductor dies 122A and 122B to the base layer 104. The adhesive film 120 may include a die attach film (DAF), a glue, or another suitable film.

Each of the semiconductor dies 122A and 122B may include a semiconductor substrate 114, a dielectric structure 116, and conductive elements 118 located at the front side thereof. The dielectric structure 116 may include multiple dielectric layers (not shown). The conductive elements 118 may be conductive pads, portions of conductive lines, or the like. In some embodiments, various device elements are formed in and/or on the semiconductor substrate 114.

Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements.

The device elements are interconnected to form integrated circuit devices through conductive features formed in the dielectric structure 116. The dielectric structure 116 may include multiple sub-layers. The conductive features may include multiple conductive lines, conductive contacts, and conductive vias. In some embodiments, electrical connections between the conductive elements 118 and the device elements are formed through the conductive features formed in the dielectric structure 116. In some embodiments, the conductive elements 118 are metal pads which may be made of aluminum or another suitable material.

The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor die 122A or 122B is a system-on-chip (SoC) chip that includes multiple functions.

In some other embodiments, the conductive elements 118 are conductive pillars that are electrically connected to conductive pads or conductive lines thereunder. A passivation layer such as a PBO layer or another suitable layer may be used to surround the conductive pillars. In some embodiments, the conductive pillars are copper pillars.

Figure 1D:
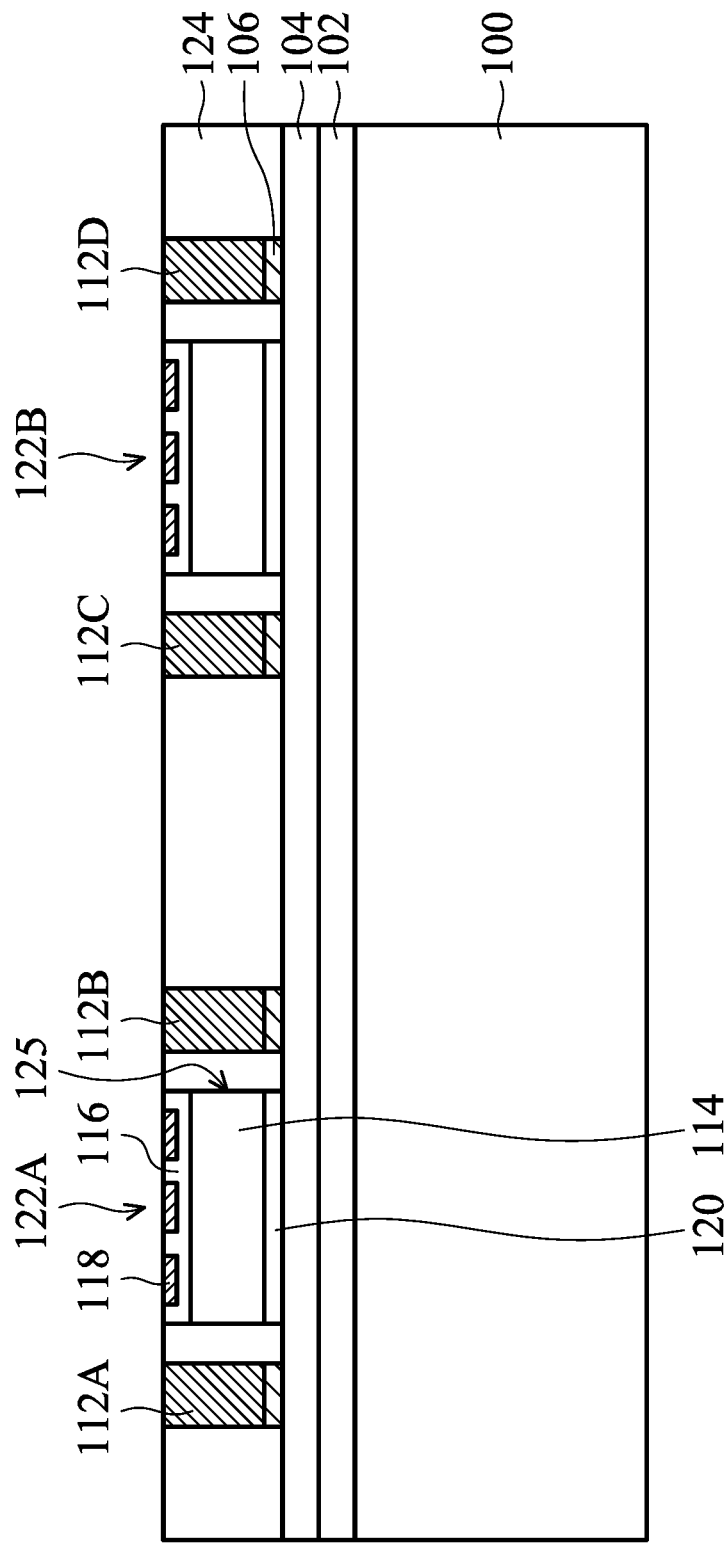

As shown in FIG. 1D, a protective layer 124 is formed over the carrier substrate 100 to surround the conductive structures 112A-112D and the semiconductor dies 122A and 122B, in accordance with some embodiments. In some embodiments, the protective layer 124 covers the sidewalls of the conductive structures 112A-112D and the semiconductor dies 122A and 122B. In some embodiments, the protective layer 124 is in direct contact with the semiconductor dies 122A and 122B. In some embodiments, an interface 125 is formed between the protective layer 124 and the semiconductor die 122A.

In some embodiments, the protective layer 124 includes a polymer material. In some embodiments, the protective layer 124 includes a molding compound material. The molding compound material may include a resin (such as an epoxy-based resin) with fillers dispersed therein. The molding compound material may include another suitable resin.

In some embodiments, the protective layer 124 is formed by injecting a molding compound material over the carrier substrate 100. In some embodiments, a transfer mold is used to assist in the formation of the protective layer 124. After or during the injecting of the molding compound material, the molding compound material does not cover the top surfaces of the conductive structures 112A-112D and/or the semiconductor dies 122A and 122B.

In some embodiments, a liquid molding compound material is disposed over the carrier substrate 100 to encapsulate or partially cover the conductive structures 112A-112D and the semiconductor dies 122A and 122B. The liquid molding compound material may be made of or include liquid state epoxy resin, liquid state epoxy acrylate, liquid state epoxy resin with filler, liquid state epoxy acrylate with filler, one or more other suitable liquid state materials, or a combination thereof. In some embodiments, a thermal process is then applied to harden the liquid molding compound material and to transform it into the protective layer 124. In some embodiments, the thermal process is performed at a temperature in a range from about 200 degrees C. to about 250 degrees C. The operation time of the thermal process may be in a range from about 0.5 hour to about 3 hours.

In some other embodiments, a liquid molding compound material is disposed over the carrier substrate 100 to cover the conductive structures 112A-112D and the semiconductor dies 122A and 122B. Afterwards, a thermal process is then applied to harden the liquid molding compound material and to transform it into the protective layer 124. A thinning process is then used to thin down the protective layer 124 until the conductive structures 112A-112D and/or the conductive elements 118 are exposed.

Figure 1E:
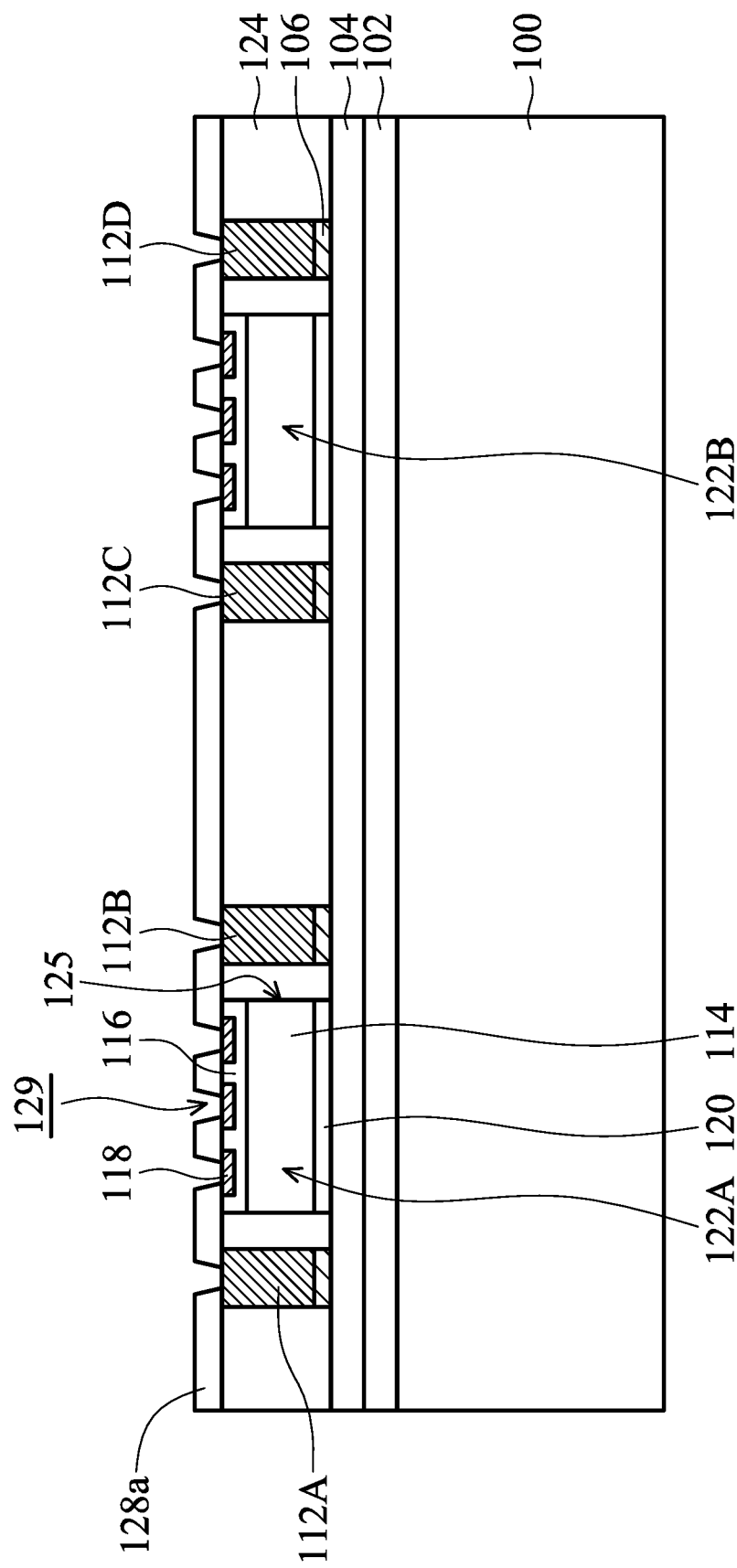

As shown in FIG. 1E, a dielectric layer 128a is formed over the protective layer 124, the conductive structures 112A-112D, and the semiconductor dies 122A and 122B, in accordance with some embodiments. In some embodiments, the dielectric layer 128a is made of or includes one or more polymer materials or other suitable materials. The dielectric layer 128a may be made of or include polybenzoxazole (PBO), polyimide (PI), silicon oxide, another suitable material, or a combination thereof. In some embodiments, the dielectric layer 128a is formed using a spin coating process, a spray coating process, a CVD process, another applicable process, or a combination thereof.

As shown in FIG. 1E, the dielectric layer 128a is patterned to form multiple openings 129, in accordance with some embodiments. In some embodiments, some of the openings 129 correspondingly expose the conductive structures 112A-112D. In some embodiments, some of the openings 129 correspondingly expose the conductive elements 118 of the semiconductor dies 122A and 112B. In some embodiments, the openings 129 are formed using a photolithography process, a laser drilling process, an etching process, an energy beam writing process, another applicable process, or a combination thereof.

Figure 1F:
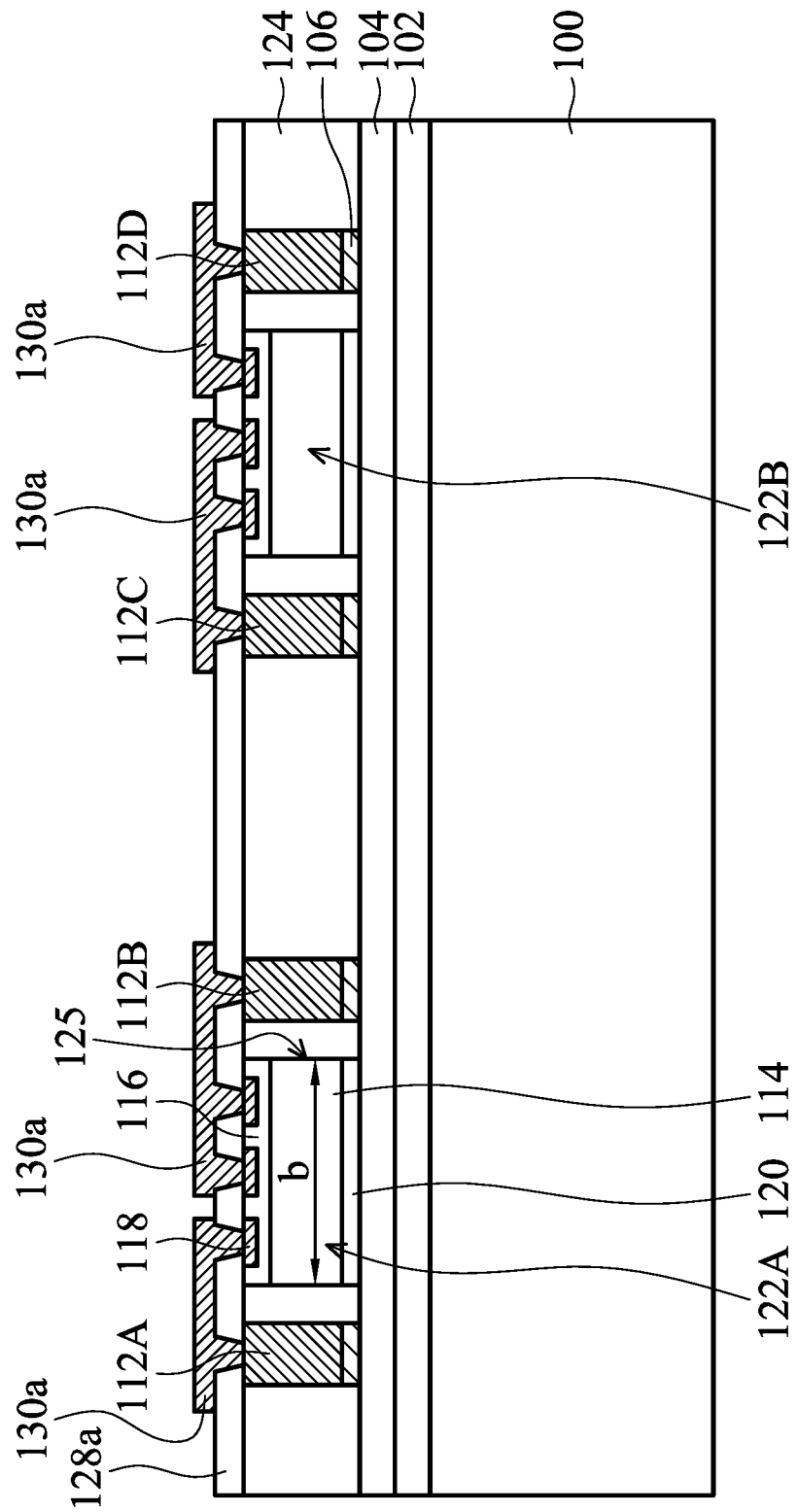

As shown in FIG. 1F, multiple conductive layers (or redistribution layers) including conductive layers 130a are formed over the dielectric layer 128a, in accordance with some embodiments. In some embodiments, the conductive layers 130a are in direct contact with the dielectric layer 128a. In some embodiments, the dielectric layer 128a is in direct contact with the protective layer. In some embodiments, the conductive layers 130a are separated from the protective layer 124 by the dielectric layer 128a.

In some embodiments, each of the conductive layers 130a fills the corresponding opening 129. In some embodiments, In some embodiments, each conductive structure 112A to 112D is electrically connected to a corresponding one of the conductive layers 130a through a corresponding one of the openings 129. In some embodiments, each conductive feature 118 (such as a conductive pad) of the semiconductor die 122A is electrically connected to a corresponding one of the conductive layers 130a through a corresponding one of the openings 129. In some embodiments, the conductive structure 112A is electrically connected to one of the conductive features 118 of the semiconductor die 122A through the corresponding one of the conductive layers 130a.

In some embodiments, the conductive layers 130a are made of or include a metal material. The metal material may include copper, aluminum, titanium, cobalt, gold, platinum, another suitable material, or a combination thereof. In some embodiments, the conductive layers 130a are formed using an electroplating process, an electroless plating process, a PVD process, a CVD process, another applicable process, or a combination thereof. A pattern mask layer and an etching process may be used to pattern a conductive material layer such that the conductive layers 130a with desired patterns are formed.

Figure 2:
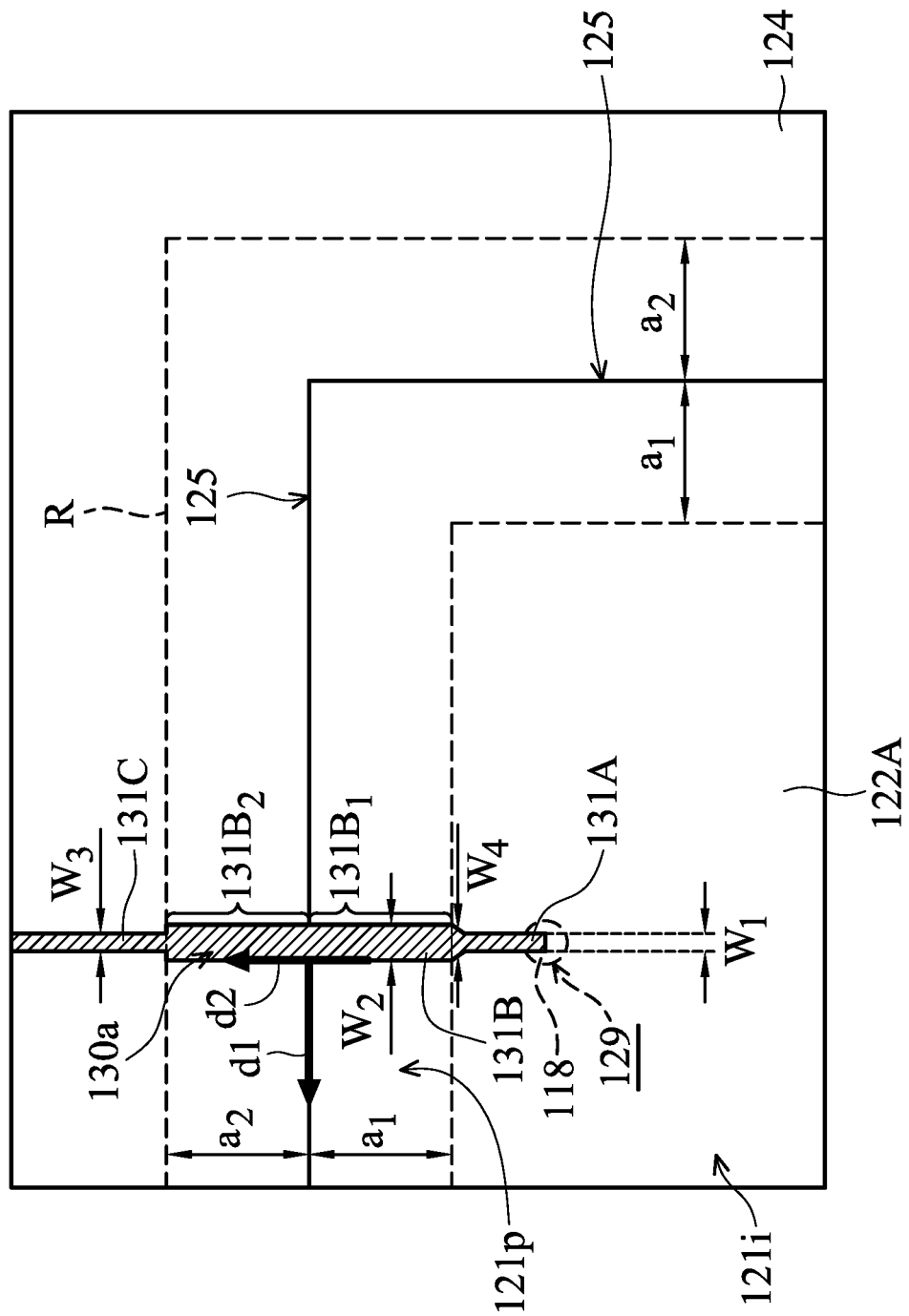
FIG. 2 is a partial top view of an intermediate stage of a process for forming a chip package, in accordance with some embodiments.

FIG. 2 is a partial top view of an intermediate stage of a process for forming a chip package, in accordance with some embodiments. In some embodiments, FIG. 2 is a top view of a portion of the structure shown in FIG. 1F. FIG. 2 shows the relationship between one of the conductive layers 130a and the interface 125 between the semiconductor die 122A and the protective layer 124. For clarity, the dielectric layer 128a between the conductive layer 130a and the semiconductor die 122A (or the protective layer 124) is not shown in FIG. 2.

In some embodiments, the conductive layer 130a has a first portion 131A and a second portion 131B, as shown in FIG. 2. In some embodiments, the first portion 131A is closer to an inner portion 121i of the semiconductor die 122A than the second portion 131B. In some embodiments, the second portion 131B has a greater line width than the first portion 131A. In some embodiments, the second portion 131B has a greater stress resistance than the first portion 131A. The second portion 131B may have a higher mechanical strength to sustain stress (such as thermal stress).

In some embodiments, the first portion 131A is in direct contact with the second portion 131B. In some embodiments, the conductive layer 130a is electrically connected to one of the conductive elements 118, as shown in FIGS. 1F and 2. In some embodiments, the first portion 131A is between the second portion 131B and the conductive element 118. In some embodiments, the conductive layer 130a has a portion filling one of the openings 129. The portion filling the opening may form a conductive via. The first portion 131A is electrically connected to the conductive element 118 of the semiconductor die 122A through the conductive via.

In some embodiments, the second portion 131B extends across the interface 125 between the semiconductor die 122A and the protective layer 124. The first portion 131A does not extend across the interface 125. In these cases, the second portion 131B may also be referred to as an interface-crossing section. In some embodiments, the sizes and/or shapes of the first portion 131A and the second portion 131B are different from each other. In some embodiments, the first portion 131A and the second portion 131B are patterned from the same conductive layer. In some embodiments, the first portion 131A and the second portion 131B are made of the same material.

In some embodiments, the semiconductor die 122A and the protective layer 124 have different thermal expansion coefficients. As a result, high thermal stress may be generated near the interface 125 between the semiconductor die 122A and the protective layer 124 during subsequent formation processes and/or operation of the final product. Therefore, the second portion 131B of the conductive layer 130a that extends across the interface 125 may suffer higher thermal stress than the first portion 131A.

In some embodiments, because the second portion 131B is wider than the first portion 131A, the second portion 131B has a higher strength (or higher stress resistance) to sustain the higher thermal stress. The conductive layer 130a is therefore prevented from being damaged or broken near the interface 125. The quality and reliability of the conductive layer 130a are significantly improved.

As shown in FIG. 2, the second portion 131B has a line width $W_2$, and the first portion 131A has a line width $W_1$. The width $W_2$ is greater than the width $W_1$. In some embodiments, the line width $W_1$ is the average line width of the first portion 131A. In some embodiments, the line width $W_2$ is the average line width of the second portion 131B. In some embodiments, the second portion 131B has a substantially uniform line width.

In some embodiments, the line width ratio ($W_1/W_2$) of the first portion 131A to the second portion 131B is in a range from about 0.2 to about 0.8. However, embodiments of the disclosure are not limited thereto. The line width ratio ($W_1/W_2$) may be in a different range. In some other embodiments, the line width ratio ($W_1/W_2$) is in a range from about 0.3 to about 0.7. In some cases, if the line width ratio ($W_1/W_2$) is greater than about 0.8 (or 0.7), the line width $W_2$ might not be wide enough to sustain the high thermal stress. In some other cases, if the line width ratio ($W_1/W_2$) is lower than about 0.2 (or 0.3), the line width $W_2$ might be too wide, leading to short circuiting between two neighboring conductive layers. In some embodiments, the line width $W_2$ of the second portion 131B is in a range from about 10 μm to about 30 μm. However, embodiments of the disclosure are not limited thereto. In some other embodiments, the line width $W_2$ is in a range from about 1 μm to about 50 μm.

As shown in FIG. 2, the semiconductor die 122A has a peripheral portion 121p and the inner portion 121i. The peripheral portion 121p surrounds the inner portion 121i. As shown in FIG. 2, the peripheral portion 121p of the semiconductor die 122A, the interface 125, and a portion of the protective layer 124 adjacent to the interface 125 together form a die boundary region R (i.e., the area between the dashed lines in FIG. 2). The die boundary region R surrounds the inner portion 121i of the semiconductor die 122A.

The die boundary region R may represent the positions where the conductive layer or conductive line may suffer higher thermal stress. In some embodiments, a portion of the second portion 131B of the conductive layer 130a is positioned directly above the die boundary region R. In some embodiments, the entire second portion 131B is positioned directly above the die boundary region R. For example, the second portion 131B is formed on the portion of the dielectric layer 128a that is directly on the die boundary region R. In some embodiments, the first portion 131A of the conductive layer 130a is not positioned directly above the die boundary region R.

Because the portion of the conductive layer 130a that is directly above the die boundary region R has a greater line width, the risk of line breakage of the conductive layer 130a due to high thermal stress is significantly reduced. In some embodiments, the segment or portion of each of the conductive layers 130 extending across the interface 125 is wider than the first portion 131A. In some embodiments, there is no conductive line having a segment (or a portion) extending across the interface 125, being directly on the dielectric layer 128a, and being as wide as or narrower than the first portion 131A of the conductive layer 130a. In some embodiments, there is no conductive line that extends across the interface 125, that is directly on the dielectric layer 128a, and that has an interface-crossing section as wide as or narrower than the first portion 131A of the conductive layer 130a. Therefore, the risk of line breakage of the conductive layers 130a is significantly reduced.

As shown in FIG. 2, an inner edge of the die boundary region R is separated from the interface 125 by a first distance $a_1$. For example, the distance $a_1$ is the minimum distance between the interface 125 and the inner edge of the die boundary region R. An outer edge of the die boundary region R is separated from the interface 125 by a second distance $a_2$. For example, the distance $a_2$ is the minimum distance between the interface 125 and the outer edge of the die boundary region R. In some embodiments, the distance $a_1$ is substantially equal to the distance $a_2$.

In some embodiments, the distance $a_1$ is in a range from about 25 μm to about 50 μm. In some other embodiments, the distance $a_1$ is in a range from about 10 μm to about 70 μm. As shown in FIG. 1F, the semiconductor die 122A has a width b. In some embodiments, the ratio ($a_1$/b) of the first distance $a_1$ to the width b of the semiconductor die 122A is in a range from about 0.025 to about 0.1. However, embodiments of the disclosure are not limited thereto. In some other embodiments, the ratio ($a_1$/b) is in a range from about 0.01 to about 0.2.

As shown in FIG. 2, the second portion 131B has a first part $131B_1$ and a second part $131B_2$. The first part $131B_1$ is directly above the semiconductor die 122A. The second part $131B_2$ is directly above the protective layer 124. In some embodiments, the length of the second part $131B_2$ is equal to that of the first part $131B_1$. In some other embodiments, the length of the second part $131B_2$ is greater than that of the first part $131B_1$.

In some embodiments, the conductive layer 130a has a third portion 131C, as shown in FIG. 2. The second portion 131B is between the third portion 131C and the first portion 131A. The third portion 131C does not extend across the interface 125. In some embodiments, the third portion 131C is positioned outside of the die boundary region R. The third portion 131C has a line width $W_3$. In some embodiments, the third portion 131C has a substantially uniform line width. In some embodiments, the line width $W_3$ is an average line width of the third portion 131C. In some embodiments, the line width $W_2$ is greater than the line width $W_3$. In some other embodiments, the line widths $W_2$ and $W_3$ are the same. In some other embodiments, the line width $W_3$ is greater than the line width $W_2$.

In some embodiments, the line width of the first portion 131A adjacent to the second portion 131B becomes wider along a direction towards the second portion 131B. For example, the line width of the first portion increases from the width $W_1$ to be the width $W_4$. The width $W_4$ may gradually become greater along the direction towards the second portion 131B.

Figure 4B:
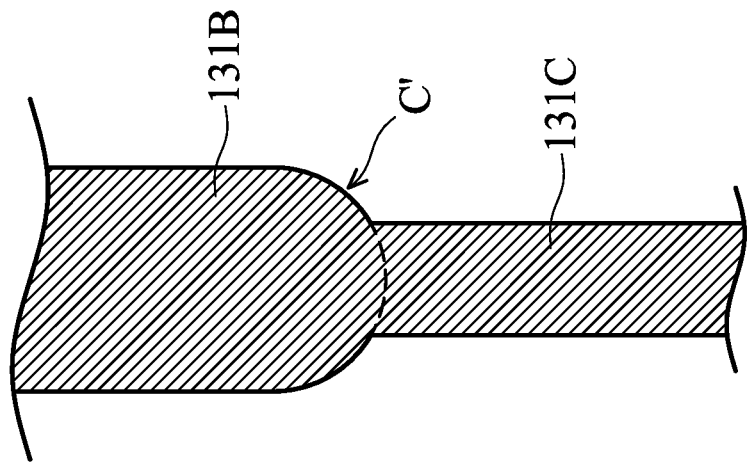
FIG. 4B is a fragmentary top view of a conductive layer in a chip package, in accordance with some embodiments.
Figure 4A:
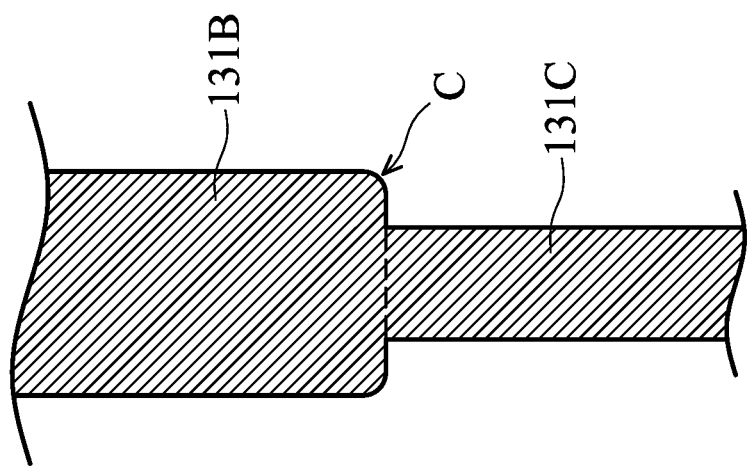
FIG. 4A is a fragmentary top view of a conductive layer in a chip package, in accordance with some embodiments.

Many variations and/or modifications can be made to embodiments of the disclosure. FIGS. 4A and 4B are fragmentary top views of a conductive layer in a chip package, in accordance with some embodiments. In some embodiments, the second portion 131B has rounded corner portions C, as shown in FIG. 4A. In some other embodiments, an edge portion C' of the second portion 131B adjacent to the first portion 131A is rounded, as shown in FIG. 4B.

As shown in FIG. 2, at least one part of the interface 125 extends along a first elongation direction d1 observed from a top view of the semiconductor die 122A and the protective layer 124. The second portion 131B of the conductive layer 130a extending across the part of the interface 125 extends along a second elongation direction d2. In some embodiments, the first elongation direction d1 is substantially perpendicular to the second elongation direction d2. In some other embodiments, the first elongation direction d1 is not perpendicular to the second elongation direction d2.

Figure 3:
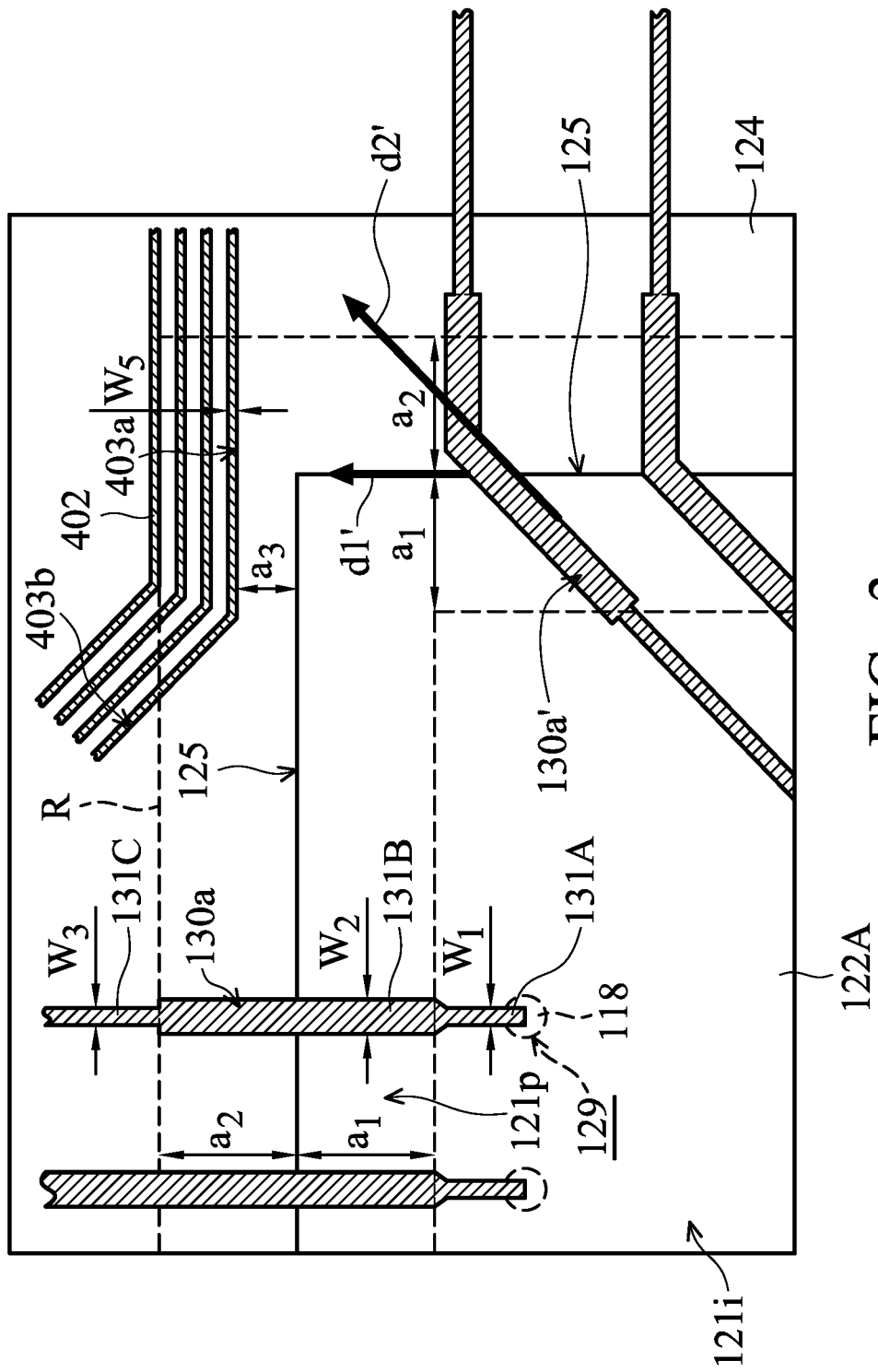
FIG. 3 is a partial top view of an intermediate stage of a process for forming a chip package, in accordance with some embodiments.

Many variations and/or modifications can be made to embodiments of the disclosure. FIG. 3 is a partial top view of an intermediate stage of a process for forming a chip package, in accordance with some embodiments. In some embodiments, FIG. 3 is a top view of a portion of the structure shown in FIG. 1F. FIG. 3 shows the relationship between the conductive layers 130a (including conductive layers 130a') and the interface 125 between the semiconductor die 122A and the protective layer 124. For clarity, the dielectric layer 128a between the conductive layer 130a and the semiconductor die 122A (or the protective layer 124) is not shown in FIG. 3.

As shown in FIG. 3, one of the conductive layers such as the conductive layer 130a' extends along an elongation direction d2'. Another part of the interface 125 may extend along an elongation direction d1'. In some embodiments, the elongation directions d1' and d2' are not perpendicular to each other.

In some embodiments, the conductive layer 130a' is electrically connected to one of the conductive elements 118 of the semiconductor die 122A. However, embodiments of the disclosure are not limited thereto. In some other embodiments, the conductive layer 130a' is not electrically connected to the conductive elements 118 of the semiconductor die 122A.

In some embodiments, there is one (or more) conductive layer 402 over the dielectric layer 128a. In some embodiments, the conductive layer 402 does not extend across the interface 125. In some embodiments, the conductive layer 402 is directly on the dielectric layer 128a. In some embodiments, the conductive layer 402 has a first segment 403a positioned directly above the die boundary region R and a second segment 403b positioned outside of the die boundary region R. In some embodiments, the shortest distance $a_3$ between the segment 403a and the interface 125 is shorter than the shortest distance $a_1$ between the first portion 131A of the conductive layer 130a and the interface 125.

In some embodiments, the segment 403a has a line width $W_5$. In some embodiments, the line width $W_5$ is less than the line width $W_2$ of the second portion 131B of the conductive layer 130a. In some embodiments, the line width $W_5$ is equal to or less than the line width $W_1$ of the first portion 131A of the conductive layer 130a.

Since the conductive layer 402 does not extend across the interface 125, the conductive layer 402 is prevented from thermal stress generated due to the different thermal expansion between the semiconductor die 122A and the protective layer 124. Therefore, in some embodiments, it is not necessary for the segment 403a directly above the die boundary region R to have a greater line width.

Referring back to FIG. 1G, a dielectric layer 128b is formed over the dielectric layer 128a and the conductive layers 130a, in accordance with some embodiments. In some embodiments, the material and formation method of the dielectric layer 128b is the same as or similar to those of the dielectric layer 128a.

However, embodiments of the disclosure are not limited thereto. In some other embodiments, the dielectric layer 128b is made of a different dielectric material than the dielectric layer 128a. In some embodiments, the dielectric layer 128b is made of silicon oxide or the like using a deposition process, such as a chemical vapor deposition (CVD) process.

Figure 1G:
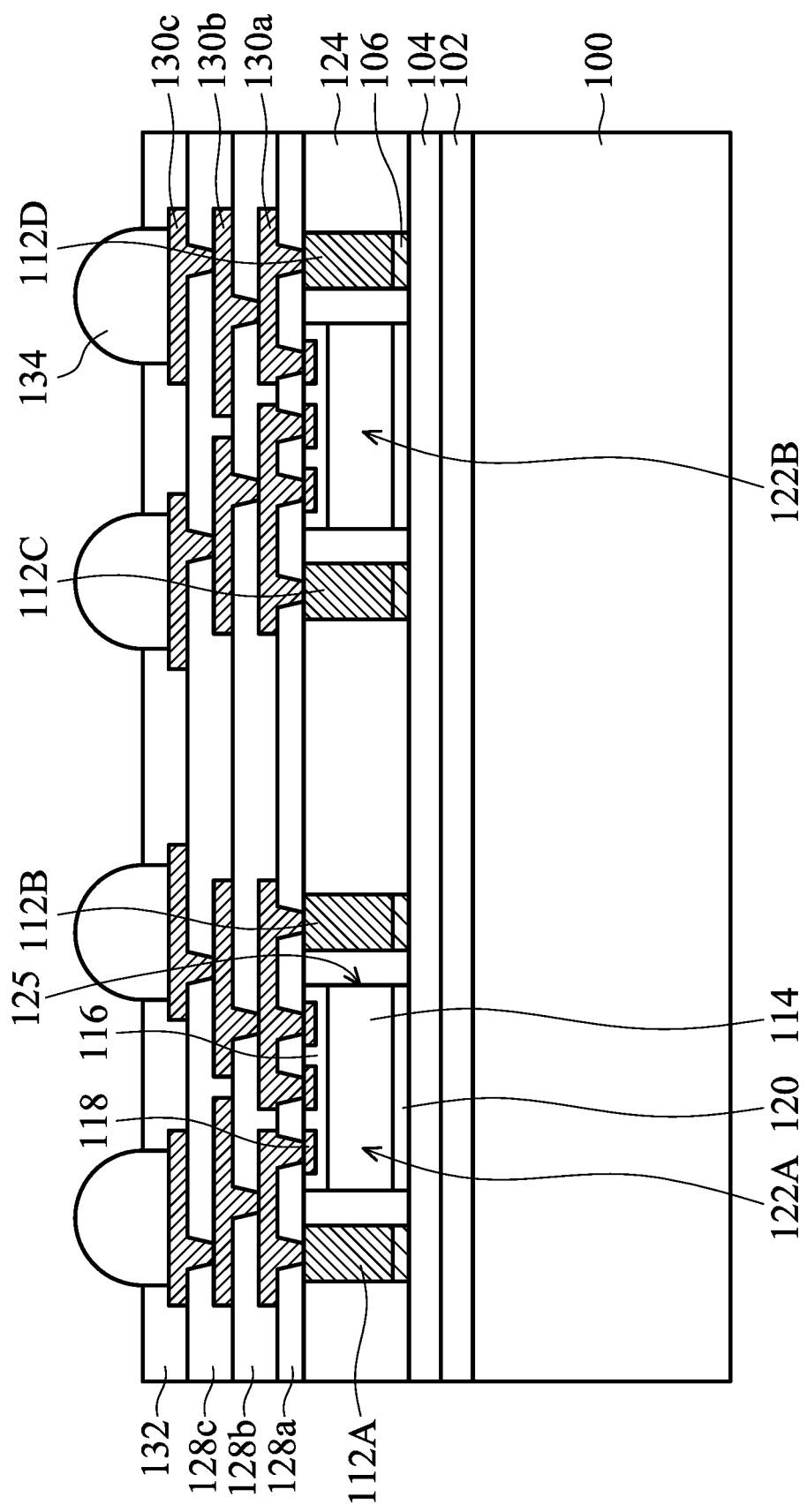

Afterwards, multiple dielectric layers including a dielectric layer 128c and a passivation layer 132 and multiple conductive layers including conductive layers 130b and 130c are formed, as shown in FIG. 1G in accordance with some embodiments. The material and formation method of the conductive layers 130b and 130c may be similar to or the same as those of the conductive layers 130a. In some embodiments, conductive bumps 134 are formed. An under bump metallurgy (UBM) layer (not shown) may be formed between the conductive bumps 134 and the conductive layers 130c.

As shown in FIG. 1G, the conductive layers 130b or 130c also have portions that extend across the interface 125. In some embodiments, the conductive layers 130b or 130c also have patterns similar to or the same as those of the conductive layer 130a. The portions of the conductive layers 130b and/or 130c that are directly above the die boundary region R may be designed to be wider to sustain the thermal stress near the interface 125. Therefore, the quality and reliability of the conductive layers 130b and 130c are also improved.

Figure 1H:
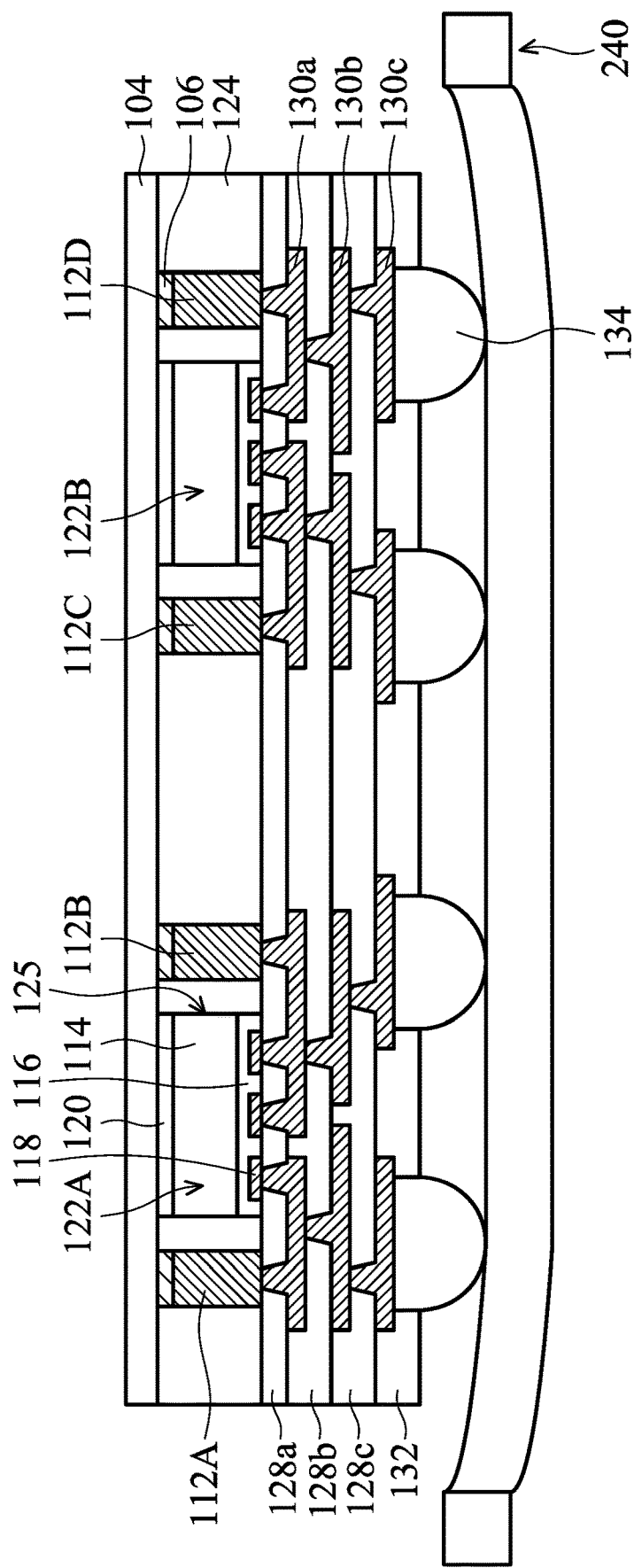

Afterwards, the structure shown in FIG. 1G is placed upside down on a carrier tape 240, as shown in FIG. 1H in accordance with some embodiments. The carrier substrate 100 and adhesive layer 102 are removed, as shown in FIG. 1H. The carrier substrate 100 and adhesive layer 102 may be removed using a light irradiation operation, a thermal operation, another applicable operation, or a combination thereof.

Figure 1I:
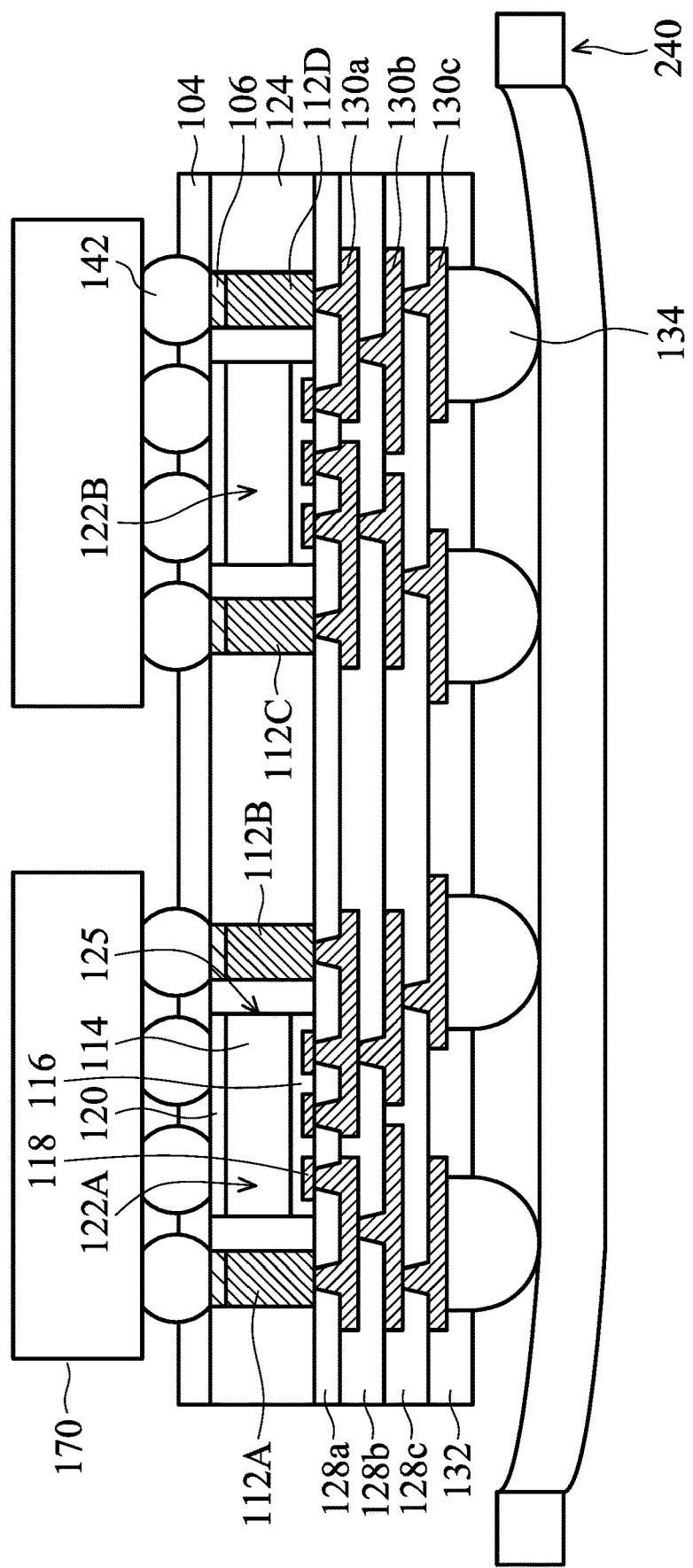

As shown in FIG. 1I, one or more elements 170 are stacked on or bonded onto the structure as shown in FIG. 1H. The element 170 may include another chip package, a semiconductor die, one or more passive devices, another suitable structure, or a combination thereof.

In some embodiments, multiple conductive bumps 142 are formed to establish electrical connections between the element 170 and the structure thereunder, in accordance with some embodiments. In some embodiments, the conductive bumps 142 are made of or include a solder material. The solder material may include tin and other metal materials. In some embodiments, the conductive bumps 142 are made of or include copper, gold, aluminum, titanium, cobalt, platinum, another suitable material, or a combination thereof.

However, embodiments of the disclosure are not limited thereto. In some other embodiments, the elements 170 and/or the conductive bumps 142 are not formed or stacked.

Figure 1J:
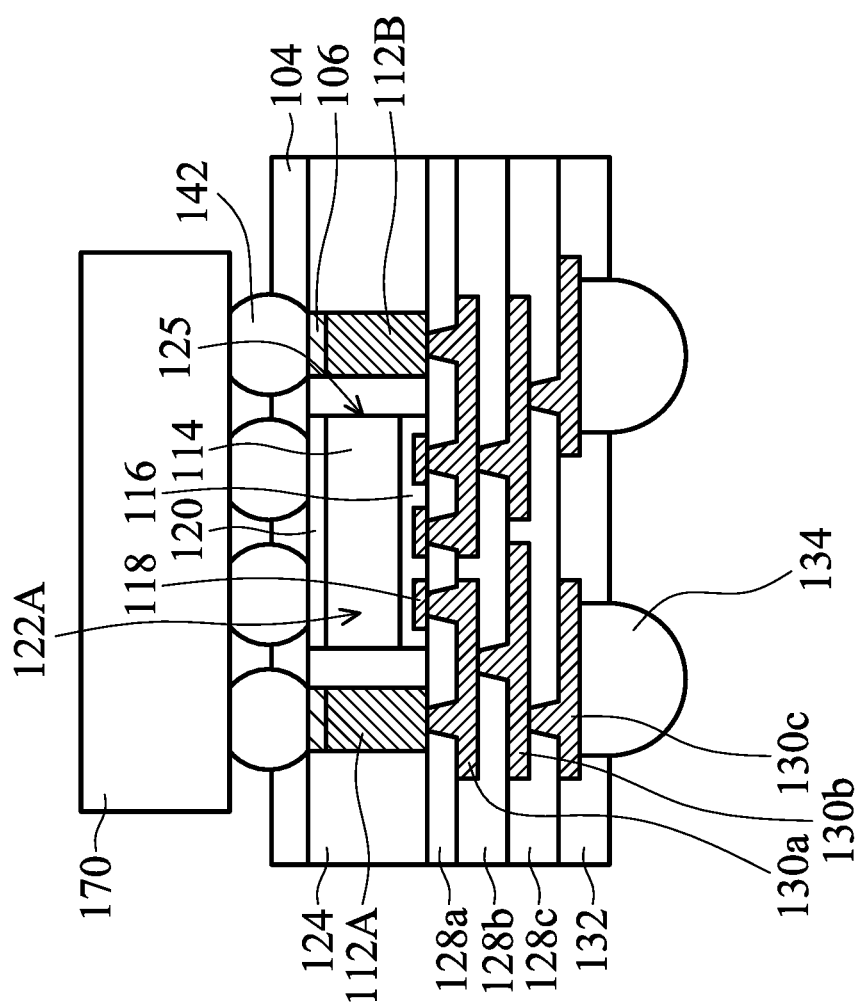

Afterwards, a dicing process (or a cutting operation) is performed to separate the structure as shown in FIG. 1I into multiple chip packages, as shown in FIG. 1J in accordance with some embodiments. As a result, a chip package with a fan-out structure is formed. In some embodiments, the carrier tape 240 is removed after the dicing process.

Many variations and/or modifications can be made to embodiments of the disclosure. In some embodiments, the element 170 is stacked before the dicing process. In some other embodiments, the element 170 is stacked after the dicing process.

Many variations and/or modifications can be made to embodiments of the disclosure. In some embodiments, the chip package include only one of the semiconductor dies such as the semiconductor die 122A. In some other embodiments, the chip package includes two or more of the semiconductor dies. For example, the chip package may include the semiconductor dies 122A and 122B.

Embodiments of the disclosure form a chip package having a semiconductor die surrounded by a protective layer. One (or more) conductive layer is formed over the semiconductor die and the protective layer. The conductive layer extends across the interface between the semiconductor die and the protective layer. The portion of the conductive layer directly above a die boundary region including the interface is designed to have a greater line width. The portion having the greater line width may have a higher strength to sustain thermal stress generated near the interface between the semiconductor die and the protective layer. Accordingly, the quality and reliability of the conductive layer are significantly improved.

In accordance with some embodiments, a chip package is provided. The chip package includes a semiconductor die and a protective layer surrounding the semiconductor die. The chip package also includes an interface between the semiconductor die and the protective layer. The chip package further includes a conductive layer over the protective layer and the semiconductor die, and the conductive layer has a first portion and a second portion. The first portion is closer to an inner portion of the semiconductor die than the second portion. The first portion is in direct contact with the second portion. The second portion extends across the interface, and the second portion has a line width greater than that of the first portion.

In accordance with some embodiments, a chip package is provided. The chip package includes a semiconductor die and a protective layer surrounding the semiconductor die. The chip package also includes an interface between the semiconductor die and the protective layer. The chip package further includes a conductive layer over the protective layer and the semiconductor die, and the conductive layer has a first portion and a second portion. The first portion is closer to an inner portion of the semiconductor die than the second portion. The second portion extends across the interface, and the second portion is wider than the first portion.

In accordance with some embodiments, a chip package is provided. The chip package includes a semiconductor die and a protective layer surrounding the semiconductor die. The chip package also includes an interface between the semiconductor die and the protective layer. The chip package further includes a conductive layer over the protective layer and the semiconductor die, and the conductive layer has a first portion and a second portion. The second portion extends across the interface, and the second portion has a greater average line width than the first portion.

In accordance with some embodiments, a chip package is provided. The chip package includes a semiconductor die and a protective layer surrounding the semiconductor die. The chip package also includes an interface between the semiconductor die and the protective layer. The chip package further includes a conductive line formed over the protective layer and the semiconductor die and having an interface-crossing section that extends across the interface and that has an enlarged line width.

In accordance with some embodiments, a chip package is provided. The chip package includes a semiconductor die and a protective layer surrounding the semiconductor die. The chip package also includes an interface between the semiconductor die and the protective layer. The chip package further includes a conductive layer over the protective layer and the semiconductor die. The conductive layer has a first portion and a second portion, and the first portion is closer to an inner portion of the semiconductor die than the second portion. The second portion extends across the interface, and the second portion has a greater stress resistance than the first portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
   a semiconductor die;
   a protective layer surrounding the semiconductor die;
   an interface between the semiconductor die and the protective layer; and
   a conductive line over the protective layer and the semiconductor die, wherein the conductive line has a first portion and a second portion in direct contact with the first portion, the second section at least partially covers the interface, and in a top view of the conductive layer, line widths of the first portion and the second portion are different from each other.

2. The chip package as claimed in claim 1, wherein in the top view of the conductive layer, the first portion has a first line width, the second portion has a second line width, and the second line width is greater than the first line width.

3. The chip package as claimed in claim 1, wherein:
   at least a part of the interface extends along a first elongation direction observed from a top view of the semiconductor die and the protective layer,
   the second portion extends along a second elongation direction observed from the top view of the conductive layer, and
   the first elongation direction is perpendicular to the second elongation direction.

4. The chip package as claimed in claim 1, wherein:
   at least a part of the interface extends along a first elongation direction observed from a top view of the semiconductor die and the protective layer,
   the second portion extends along a second elongation direction observed from the top view of the conductive layer, and
   the first elongation direction and the second elongation direction form an acute angle.

5. The chip package as claimed in claim 1, wherein:
   the interface, a peripheral portion of the semiconductor die, and a portion of the protective layer adjacent to the interface together form a die boundary region surrounding an inner portion of the semiconductor die, at least a part of the second portion is positioned within the die boundary region, the first portion is not positioned within the die boundary region, an inner edge of the die boundary region is separated from the interface by a first distance, an outer edge of the die boundary region is separated from the interface by a second distance, and the first distance is equal to the second distance.

6. The chip package as claimed in claim 5, further comprising:

a second conductive layer over the protective layer, wherein:

the second conductive layer does not extend across the interface, the second conductive layer has a segment positioned within the die boundary region, and the segment of the second conductive layer is narrower than the second portion of the conductive layer.

7. The chip package as claimed in claim 1, wherein:

the conductive layer has a third portion connected to the second portion, the second portion is between the first portion and the third portion, the third portion does not extend across the interface, and the second portion is wider than the third portion.

8. The chip package as claimed in claim 1, further comprising a dielectric layer over the semiconductor die and the protective layer, wherein the chip package comprises no conductive line that extends across the interface, that is directly on the dielectric layer, and that has an interface-crossing section as wide as or narrower than the first portion of the conductive layer.

9. The chip package as claimed in claim 1, further comprising:

a dielectric layer over the semiconductor die and the protective layer;

a second conductive layer over the dielectric layer, wherein:

the second conductive layer has a segment separated from the interface by a first distance, the first portion is separated from the interface by a second distance, the first distance is shorter than the second distance, the second conductive layer does not extend across the interface, and the segment of the second conductive layer is as wide as or narrower than the first portion of the conductive layer.

10. The chip package as claimed in claim 1, wherein:

the second portion has a first part and a second part, the first part is directly above the semiconductor die, the second part is directly above the protective layer, and the second part has a length equal to or greater than that of the first part.

11. A chip package, comprising:

a semiconductor die having an edge;

a protective layer surrounding the semiconductor die; and a conductive line extending over the protective layer and the semiconductor die, wherein the conductive line has a first portion and a second portion in direct contact with the first portion, the second portion at least partially covers the edge of the semiconductor die, and in a top view of the conductive layer, the second portion has a line width greater than that of the first portion.

12. The chip package as claimed in claim 11, further comprising a second conductive line over the protective layer, the second conductive line has no portion extending across the edge of the semiconductor die, and the second conductive line has no portion wider than the second portion.

13. The chip package as claimed in claim 11, wherein the conductive line is electrically connected to a conductive element of the semiconductor die.

14. The chip package as claimed in claim 11, wherein the conductive line is not electrically connected to the semiconductor die.

15. The chip package as claimed in claim 11, further comprising a second conductive line extending across the edge of the semiconductor die, wherein:

the second conductive line has edge-crossing section extends across the edge of the semiconductor die, the edge-crossing section has an enlarged line width in a top view of the conductive line, the conductive line is electrically connected to one of conductive elements of the semiconductor die, and the second conductive line is not electrically connected to the conductive elements of the semiconductor die.

16. A chip package, comprising:

a semiconductor die having an edge;

a protective layer surrounding the semiconductor die; and a conductive line extending over the protective layer and the semiconductor die, wherein the conductive line has an edge-crossing section, the edge-crossing section extends across the edge of the semiconductor die, and the edge-crossing section becomes narrower along a direction towards an inner portion of the semiconductor die.

17. The chip package as claimed in claim 16, wherein the conductive line is electrically connected to a conductive element of the semiconductor die.

18. The chip package as claimed in claim 16, wherein the conductive line is not electrically connected to the semiconductor die.

19. The chip package as claimed in claim 16, wherein:

the edge of the semiconductor die, a peripheral portion of the semiconductor die, and a portion of the protective layer adjacent to the edge of the semiconductor die together form a die boundary region surrounding the inner portion of the semiconductor die, at least a part of the edge-crossing section is positioned within the die boundary region, at least a portion of the conductive line is outside of the die boundary region, an inner edge of the die boundary region is separated from the edge of the semiconductor die by a first distance, an outer edge of the die boundary region is separated from the edge of the semiconductor die by a second distance, and the first distance is equal to the second distance.

20. The chip package as claimed in claim 19, further comprising:

a second conductive layer over the protective layer, wherein:

the second conductive layer does not extend across the edge of the semiconductor die, the second conductive layer has a segment positioned within the die boundary region, and the segment of the second conductive layer is narrower than the edge-crossing section of the conductive layer.

* * * * *